(12) United States Patent
Newman (10) Patent No.: US 7,592,876 B2
(45) Date of Patent: Sep. 22, 2009

(54) LEAKAGE OSCILLATOR BASED AGING MONITOR

(75) Inventor: Paul F. Newman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/298,018

(22) Filed: Dec. 8, 2005

(65) Prior Publication Data

US 2007/0132523 A1  Jun. 14, 2007

(51) Int. Cl.
*H03K 3/03* (2006.01)
*G01R 31/26* (2006.01)

(52) U.S. Cl. .............................. 331/57; 331/2; 324/769

(58) Field of Classification Search .................. 331/2, 331/57; 324/769
See application file for complete search history.

(56) References Cited

U.S. PATENT DOCUMENTS 7,212,022 B2 * 5/2007 Suzuki ....................... 324/769

2004/0263192 A1  12/2004 Persun et al.
2004/0263200 A1  12/2004 Persun et al.
2005/0140418 A1   6/2005 Muniandy et al.

OTHER PUBLICATIONS

U.S. Appl. No. 10/936,767, filed Sep. 8, 2004, Inventor: Victor M. Agostinelli Jr. et al.

* cited by examiner

*Primary Examiner*—Robert Pascal
*Assistant Examiner*—James E Goodley
(74) *Attorney, Agent, or Firm*—Guojun Zhou (57) ABSTRACT

According to embodiments of the subject matter disclosed in this application, the age of a target circuit component in a semiconductor device may be monitored by using at least one aging leakage oscillator and a reference leakage oscillator. An aging leakage oscillator is stressed whenever the target circuit component is used while a reference oscillator is not. Due to aging effects on the aging leakage oscillator, the frequency ratio between the aging and the reference leakage oscillators changes over time. Such a frequency ratio change over time may be used to determine the age of the target circuit component. Compared to CMOS based aging oscillators, the frequency ratio between an aging and a reference leakage oscillators changes more significantly over time.

21 Claims, 10 Drawing Sheets

LEAKAGE OSCILLATOR BASED AGING MONITOR

BACKGROUND

1. Field

This disclosure relates generally to semiconductor devices, and, more specifically but not exclusively, to determining the age of a semiconductor device.

2. Description

As a semiconductor device ages, the reliability of internal components begins to diminish. The semiconductor device ages during operational use during which the internal components are exposed to varying operational temperatures and voltages. In fact, the effects of aging are proportional to the cumulative temperatures and voltages experienced during use. Thus, internal components which operate at higher temperatures and voltages age faster and deteriorate quicker than those components experiencing more moderate temperatures and voltages.

One such aging effect is Hot Carrier Degradation. Hot Carrier Degradation results when charge carriers become trapped within the gate oxide of a transistor. The trapped charge carriers accumulate over time, creating a built-in charge within the gate oxide of the transistor. This trapped charge decreases the carrier mobility across the channel of the transistor and alters the transistor threshold voltage ("VTH"). Hot Carrier Degradation is aggravated by elevated operating temperatures and voltage, and has a cumulative effect proportional to age. Negative-type metal oxide semiconductor ("NMOS") components are particularly susceptible to Hot Carrier Degradation.

Another such aging effect is Negative Bias Temperature Instability ("NBTI"). The NBTI mechanism is an electrochemical reaction that involves the electric field, holes, silicon-hydrogen bonds, and temperature. During operation, DC bias voltages generate interface traps between the gate oxide and silicon substrate of a transistor. These interface traps accumulate over time and have the effect of shifting the VTH and reducing drive current. Positive-type metal oxide semiconductor ("PMOS") devices particularly suffer from the NBTI effect.

Accordingly, different internal components of an integrated circuit have varying reliable lifetimes. These reliable lifetimes are dependent upon localized environments subjected to localized operational voltages and temperatures and upon the specific stress history of the circuit component. Components residing in high-use, high-stress environments will have shorter reliable lifetimes.

One approach to measuring the age of a circuit component in a semiconductor device is based on complementary metal oxide semiconductor ("CMOS") based oscillator circuits located in proximity of the circuit component. A pair of oscillators, one configured to leave no voltage stress across the PMOS transistors when disabled and the other with PMOS transistors stressed when disabled. The pair is designed to be as similar as possible so their oscillation periods will match closely. The unstressed oscillator serves as an in situ reference, providing an effective measure of temperature and supply voltage during tests before and after stress. Measurements of the reference oscillator can be used to correct for different voltages and temperatures during pre and post stress tests. Using the state-of-the-art CMOS processes, oscillator periods will typically vary about 1% for a 10 mV supply change and 1% for 10° C. change in temperature. Aging effects for oscillators are expected to be in the range of a few percent over the lifetime of a product. Accelerated life tests used to measure the aging effect may only show a few percent change in period depending on the voltage, temperature, and duration of the experiment. Because the change of oscillator periods is so small even during the lifetime of the circuit component, it is desirable to have a different aging monitor circuits whose characteristics change more substantially than a CMOS based oscillator circuit over time.

BRIEF DESCRIPTION OF THE DRAWINGS

The features and advantages of the disclosed subject matter will become apparent from the following detailed description of the subject matter in which.

DETAILED DESCRIPTION

According to embodiments of the subject matter disclosed in this application, the age of a target circuit component in a semiconductor device may be monitored by using at least one aging oscillator and a reference oscillator. An aging oscillator is stressed whenever the target circuit component is used while a reference oscillator is not. As a result, the aging oscillator ages over time while the reference oscillator does not. Were there no aging for the aging oscillator, the ratio of frequencies measured at the same conditions between the aging oscillator and the reference oscillator would remain relatively stable over time. Because of aging effects on the aging oscillator, such a frequency ratio will change over time. Thus, the age of the target circuit component may be computed based on the change of the frequency ratio between the aging oscillator and the reference oscillator.

Leakage oscillators may be used for both the aging and the reference oscillators. Compared to CMOS based aging oscillators, the response of an aging leakage oscillator to cumulative voltage and temperature stress is larger. Thus, it is easier to determine the age of a target circuit component in a semiconductor device by using leakage oscillators as both the aging and the reference oscillators than by using CMOS based oscillators for the aging and the reference oscillators.

Reference in the specification to "one embodiment" or "an embodiment" of the disclosed subject matter means that a particular feature, structure or characteristic described in connection with the embodiment is included in at least one embodiment of the disclosed subject matter. Thus, the appearances of the phrase "in one embodiment" appearing in various places throughout the specification are not necessarily all referring to the same embodiment.

Figure 1:
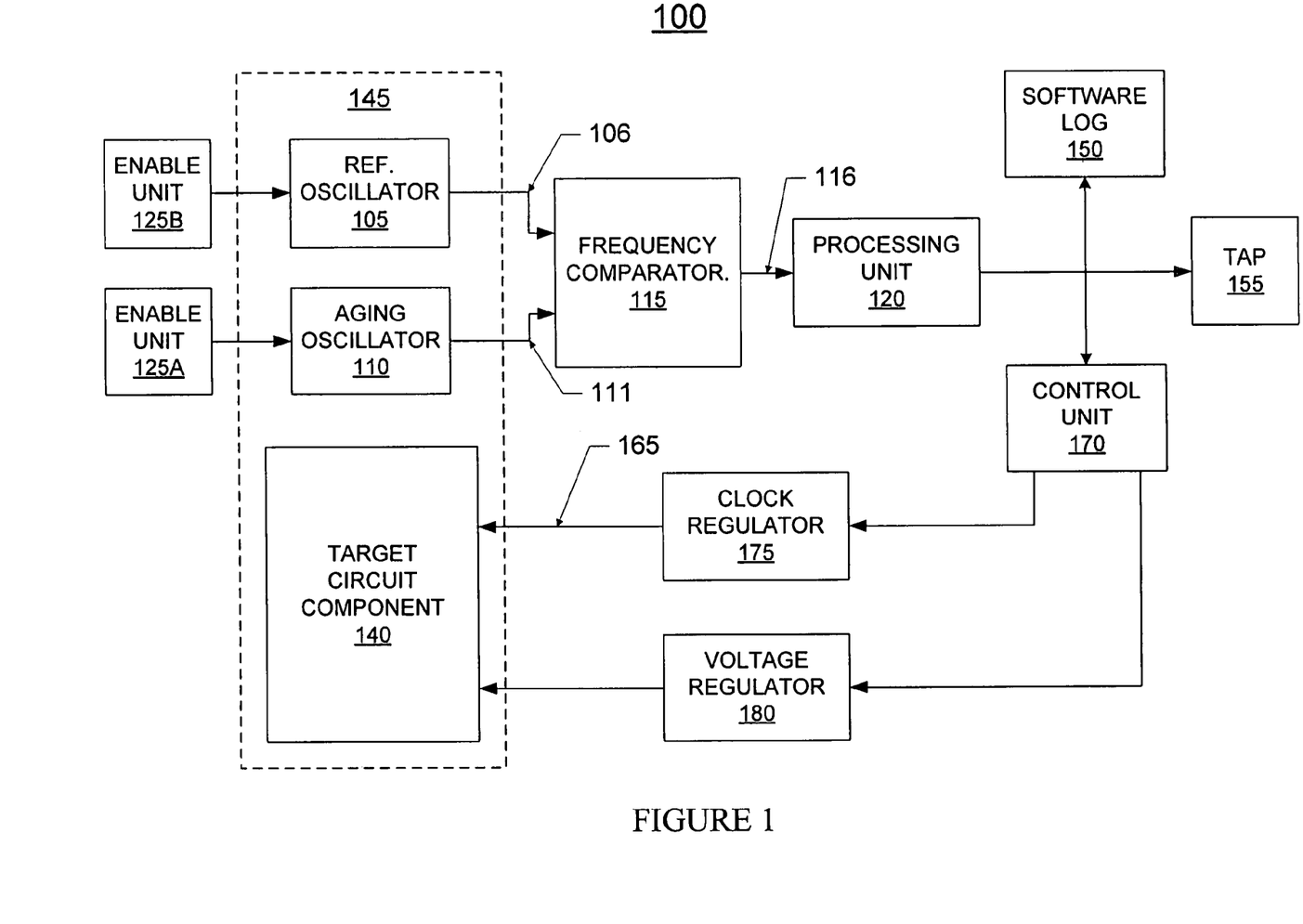
FIG. 1 is a block diagram illustrating an aging monitor in a semiconductor device.

FIG. 1 is a block diagram illustrating an aging monitor for a target circuit component in a semiconductor device. The illustrated embodiment of aging monitor 100 includes a reference oscillator circuit 105, one or more aging oscillator circuits 110, a frequency comparator 115, a processing unit 120, and enable units 125A and 125B.

In one embodiment, aging oscillator circuit 110 includes a ring oscillator that generates an aging clock signal 111 having an aging frequency $f_{AGE}$ that may change over time. Enable unit 125A is coupled to selectively enable or disable aging oscillator circuit 110. The aging oscillator circuit only generates the aging clock signal when enabled. One or more components in the aging oscillator circuit may degrade over time when stressed. The degradation of this/these component(s) may cause the aging frequency $f_{AGE}$ to change. Aging oscillator circuit 110 is positioned proximate/adjacent to target circuit component 140 (as illustrated with box 145) such that aging oscillator circuit 110 and target circuit component 140 may experience similar localized operational stresses (e.g., temperature, voltage, etc.). In one embodiment, component(s) in the aging oscillator circuit whose degradation causes $f_{AGE}$ to change over time may be put under stress when the aging oscillator circuit is disabled. The aging oscillator circuit is disabled during normal operational time of the target circuit component. The aging oscillator circuit is enabled only when the aging frequency $f_{AGE}$ is measured. In another embodiment, component(s) in the aging oscillator circuit whose degradation causes $f_{AGE}$ to change over time may be put under stress when the aging oscillator circuit is enabled. The aging oscillator is always enabled whenever the target circuit component is operational. In either embodiment or any other embodiment, the aging oscillator circuit and the target circuit component are exposed to a similar operating environment. Thus, degradation in the aging oscillator circuit and the target circuit component will be correlated.

In one embodiment, reference oscillator circuit 105 includes a ring oscillator that generates a reference clock signal 106 having a reference frequency $f_{REF}$. Enable unit 125B is coupled to selectively enable or disable reference oscillator circuit 105. In one embodiment, reference oscillator circuit 105 is enabled for short periods of time, just long enough to compare $f_{REF}$ Of reference clock signal 106 with $f_{AGE}$ of aging clock signal 111. When reference oscillator circuit 105 is disabled, components in the reference oscillator circuit are not stressed and are electrically isolated from target circuit component 140. Thus, when the reference oscillator circuit is disabled, it does not experience the aging effects experienced by the target circuit component. Relative to the cumulative operating time of the target circuit component and the aging oscillator circuit, the reference oscillator circuit is operated for very short periods of time so that it will not age significantly.

In one embodiment where the aging oscillator circuit is disabled during the normal operational time of the target circuit component, the aging oscillator circuit and the reference oscillator circuit may share one enable unit. In this embodiment, both the aging and the reference oscillator circuits are enabled only for a short period to obtain $f_{AGE}$ and $f_{REF}$. However, during the normal operational time of the target circuit component, the aging oscillator circuit is put under stress in a way similar to or the same as the target circuit component while the reference oscillator circuit is not stressed.

During operational use, devices (e.g., aging oscillator circuit 110, target circuit component 140, and the like) are subjected to operational factors, such as temperature and voltage. These operational factors stimulate cumulative aging effects such as Negative Bias Temperature Instability ("NBTI") and the like. These aging effects cause the devices to degrade in a statistically predictable manner that is proportional to operational time. Were there no aging effects on the aging oscillator circuit, the ration between $f_{AGE}$ and $f_{REF}$ would remain relatively stable over time. Because of the aging effects, the ration between $f_{AGE}$ and $f_{REF}$ changes over the operational time. Accordingly, comparing $f_{AGE}$ of the aging clock signal, which is controlled by enable unit 125A to age at the same rate as target circuit component 140, with $f_{REF}$ of reference clock signal 106, which is controlled by enable unit 125B to age a negligible amount, provides a sort of odometer reading that tracks the operational age of the target circuit component. In other words, the amount $f_{REF}$ deviates from $f_{AGE}$ will be proportional to the operational age of the target circuit component.

In one embodiment, frequency comparator 115 is coupled to receive and compare reference clock signal 106 and aging clock signal 111. In response, frequency comparator 115 generates an age signal 116 that is proportional to the operational age of target circuit component 140. Age signal 116 generated by the frequency comparator may then be input into processing unit 120 for processing.

In one embodiment, processing unit 120 may be a processing engine, such as a processor core, or even a software engine executed by a processor. The processing unit may execute one or more of a number of functions on age signal 116. In one embodiment, the processing unit may generate a software log 150 to store periodic odometer readings indicating the operational age of target circuit component 140. The software log may be generated by the processing unit with reference to a lookup table indexing values of age signal 116 to age values (e.g., operational time measured in years, days, hours or the like). The approximated ages for each index value of age signal 116 may be computed and stored to the lookup table using known models of how semiconductors devices age. Alternatively, the approximated ages may be determined by subjecting a test chip to operational conditions for a period of time, measuring the frequency degradation, and extrapolating the frequency degradation over longer periods of time. Other techniques for computing the operational age of the target circuit component based on age signal 116 may be implemented within the spirit of the disclosed subject matter.

Processing unit 120 may output age values to a test access port ("TAP") 155. TAP 155 may be accessible by a technician wishing to obtain diagnostic measurements and data. It should be appreciated that the processing unit may be bypassed altogether and age signal 116 directly coupled to the TAP for direct output. The age values from the processing unit 120 or the age signal may be stored in registers and/or memory so that they can be accessed by a processor, an operating system ("OS"), a basic input and output system ("BIOS") and/or other hardware and software applications.

The components of aging monitor 100 may be coupled into a feedback loop to control a clock frequency $f_{CLK}$ of a logic clock signal 165 timing target circuit component 140 and/or to control a supply voltage VCC powering target circuit component 140. Processing unit 120 may provide age readings to a control unit 170. In one embodiment, the control unit is coupled to a clock regulator circuit 175 to control $f_{CLK}$ of logic clock signal 165, based at least in part on the age value being representative of the operational age of the target circuit component. In one embodiment, the control unit is coupled to a voltage regulator circuit 180 to control the supply voltage VCC, based at least in part on the age value being representative of the operational age of the target circuit component. It should be appreciated that the processing unit could be bypassed and age signal 116 could be coupled directly to the control unit.

Figure 2:
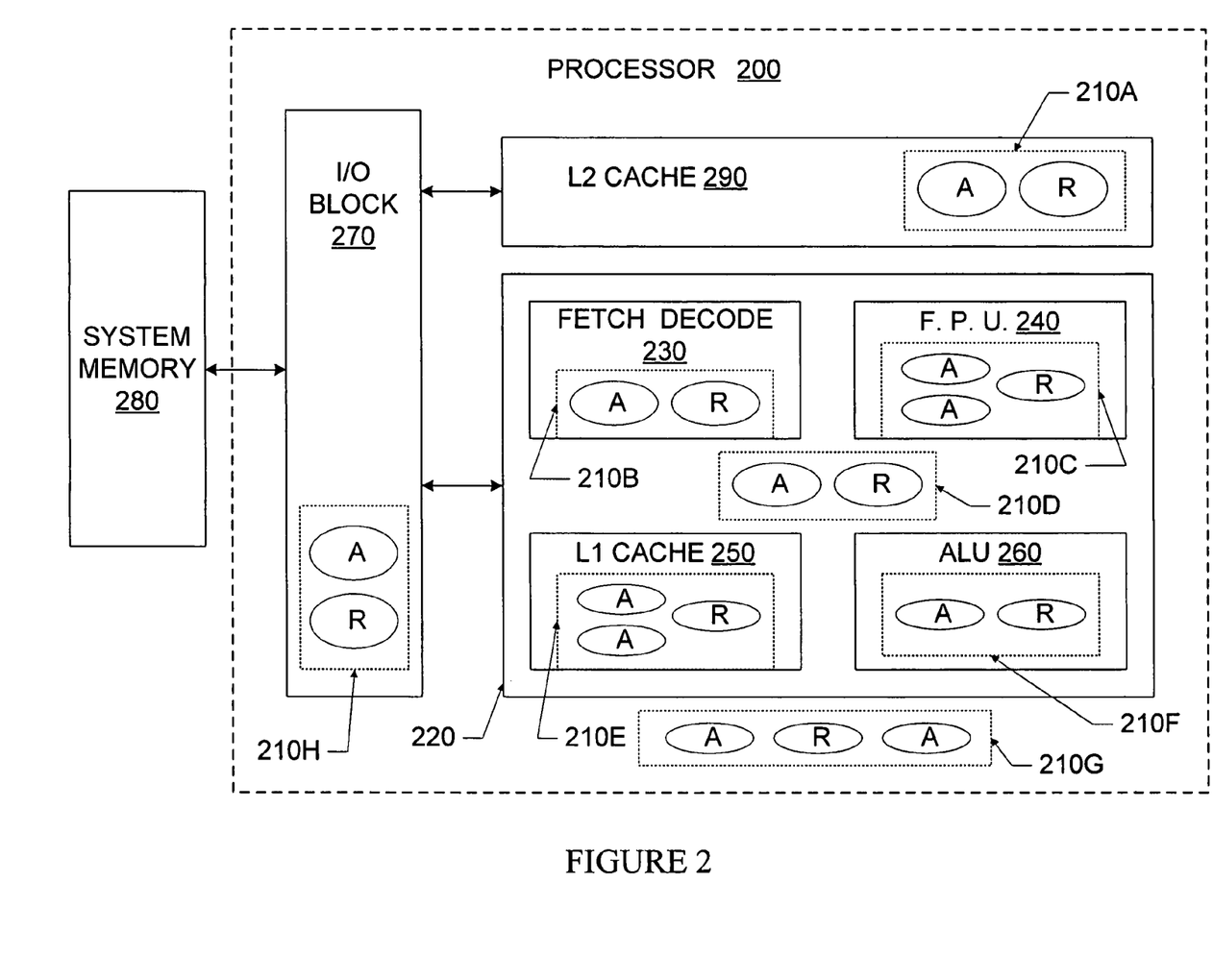
FIG. 2 is a block diagram illustrating a processor having multiple aging monitors to track operational age of multiple circuit components.

FIG. 2 is a block diagram illustrating a processor having multiple aging monitors to track operational age of multiple circuit components. The illustrated embodiment of processor 200 includes a core 220, level-2 ("L2") cache 290, and an input/output ("IO") block 270. The I/O block may be coupled to a system memory 280 located outside the processor. The illustrated embodiment of core 220 may include a fetch decode unit 230, a floating-point math unit ("FPU") 240, L1 cache 250, and an arithmetic logic unit ("ALU") 260. It should be appreciated that one or more elements of processor 200 and core 220 have been excluded from FIG. 2 for the sake of clarity.

As illustrated, processor 200 may include several instances of aging monitor circuits (e.g., aging monitor 100 as shown in FIG. 1) strategically disposed across the die of processor 200. The aging monitor circuits may include only one reference oscillator circuit (labeled as an "R") and one aging oscillator circuit (labeled as an "A"), e.g., aging monitor circuits 210A, 210B, 210F, and 210H included within L2 cache 290, fetch decode unit 230, ALU 260, and I/O block 270, respectively. Alternatively, the aging monitor circuits may include one reference oscillator circuit, but multiple aging oscillator circuits to track multiple operating modes of the subcomponent (e.g., aging monitor circuits 210C and 210E included within FPU 240 and L1 cache 250, respectively). In one embodiment, some or all of the components inside core 220 may share one aging monitor circuit (e.g., 210D). Similarly, some or all of the components inside processor 200 may share one aging monitor circuit (e.g., 210G). Finally, although not illustrated, a single reference oscillator circuit may be shared between multiple (or even all) the aging monitor circuits to conserve the die area.

Although the aging monitor circuits are illustrated as internal to each subcomponent of processor 200, it should be appreciated that the aging monitor circuits may simply be disposed adjacent to or in close proximity to the corresponding subcomponent for which a particular aging monitor circuit is tracking. An aging monitor circuit may be disposed in strategic "hot zones" of processor 200 that generate high temperatures (e.g., FPU 240, ALU 260, etc.) or dispersed evenly (or randomly) across the die of processor 200 to accumulate general die aging data. Accordingly, embodiments of the disclosed subject matter facilitate an aging record capable of tracking the operational age of an entire die in general, tracking the operational age of particular subcomponents, and even capable of tracking time spent by subcomponents within individual operating modes. This aging information may be logged over a defined period of time and periodically transmitted over a network to a central repository for use by original equipment manufacturers ("OEMs") and the like. This aging information may also be used to throttle global or local clocks (e.g., logic clock signal 165 as shown in FIG. 1) and adjust global or local supply voltages.

If an integrated circuit ("IC"), such as processor 200, is enabled (e.g., by using aging monitor circuits) to detect circuit components that are subject to high-stress, and therefore rapid aging, in the user environment, circuit designers may make the affected circuit components more robust, thereby extending the functional lifetime of the entire IC. Alternatively, if the aging of circuit components can be detected by automatic mechanisms (such as aging monitor circuits) while in the user environment, then ICs may be developed with the built-in ability to adapt operating modes to reduce the likelihood of failure, and thereby extend the functional lifetime of the entire IC.

Both the reference oscillator and the aging oscillator in an aging monitor circuit may be implemented using CMOS-based circuit components. The reference oscillator circuit is located in proximity of the circuit component is configured to leave no stress across the PMOS transistors when disabled. The aging oscillator circuit is configured with PMOS transistors stressed when disabled. The reference and aging oscillators are designed to be as similar as possible so their oscillation periods will match closely. However, even with the state-of-the-art CMOS processes, aging effects for CMOS-based oscillator periods are expected to be in the range of a few percent over the lifetime of a product. Because the change of oscillator periods is so small over time, it is desirable to set the measurement conditions, voltage and temperature, precisely the same for the measurements before the stress is applied and after aging, which is not easy to achieve.

Figure 3:
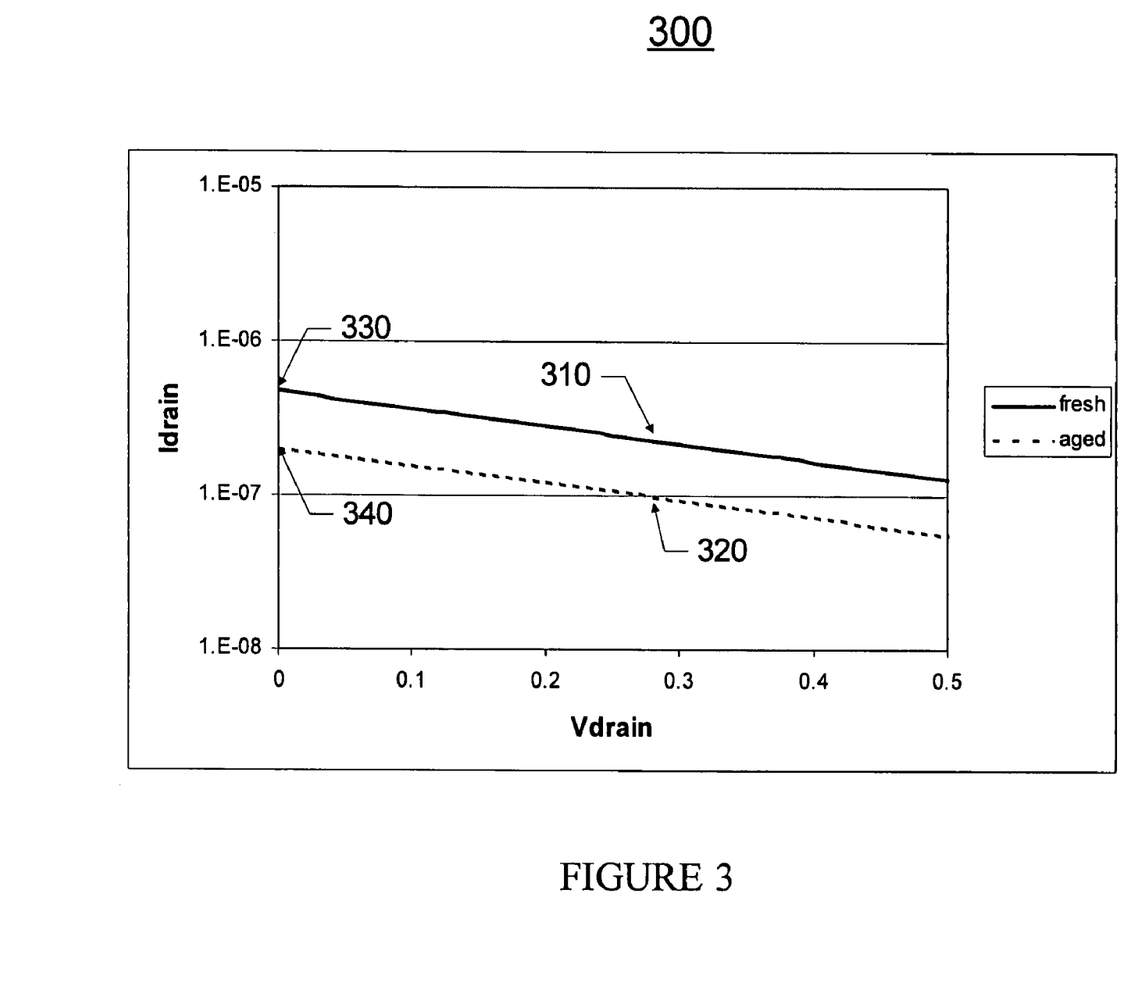
FIG. 3 is a graph illustrating how the leakage current of a PMOS transistor changes before and after aging due to stress.

According to one embodiment of the disclosed subject matter, both the reference and aging oscillators in an aging monitor circuit may be implemented using leakage oscillators. In a leakage oscillator, an NMOS transistor or a PMOS transistor is used as a leakage transistor. The frequency of the leakage oscillator is proportional to the leakage current of the leakage transistor. FIG. 3 is a graph illustrating how the leakage current of a PMOS transistor changes before and after aging due to stress. The transistor has its gate and source connected to a supply voltage, Vcc. The x-axis of the graph shows the drain voltage and the y-axis shows the current flowing from the drain (i.e., $I_d$). Both curve 310 and curve 320 show how $I_d$ changes with respect to $V_d$ when the gate to source voltage is 0V (i.e., $V_{gs}$=0V). Curve 310 shows the relationship between $I_d$ and $V_d$ at an early stage of the life of the PMOS transistor where the transistor has not significantly aged yet; while curve 320 shows the relationship between $I_d$ and $V_d$ at a later stage of the transistor's life where the transistor has significantly aged over time. The threshold voltage after aging has decreased (the magnitude of the threshold voltage as increased) and a more negative gate voltage is required to turn on the transistor. Point 330 indicates the leakage current of the un-aged transistor when the full supply voltage is present across the transistor. Point 340 is the leakage current of the aged transistor when subjected to the full supply voltage. Note that the y-axis is a logarithmic scale and that the leakage current is lower in the aged transistor, curve 320; as compared to the un-aged one, curve 310. Also, note that the ratio of the leakage currents is relatively constant (represented by a constant difference on a log plot).

Simulations show that an aging monitor circuit may give many times change (e.g., 50 times or more) in oscillator frequency compared to a CMOS-based aging monitor circuit subjected to the same voltage and temperature stress conditions. Additionally, because the leakage current is typically very small, a leakage oscillator may use relatively large devices for the leakage transistor without a power penalty. Using a large leakage device allows one to minimize random differences in the periods between the reference and aging oscillators as manufactured and thus may help eliminate the need to record the initial differences in periods between the beginning of life or "fresh" and unstressed oscillator. In contrast, with a CMOS-based oscillator it is difficult to distinguish between phenomena (e.g., differences caused by manufacturing process, aging, etc.) affecting the NMOS and PMOS transistors because the frequency change resulting from aging is so small.

Figure 4:
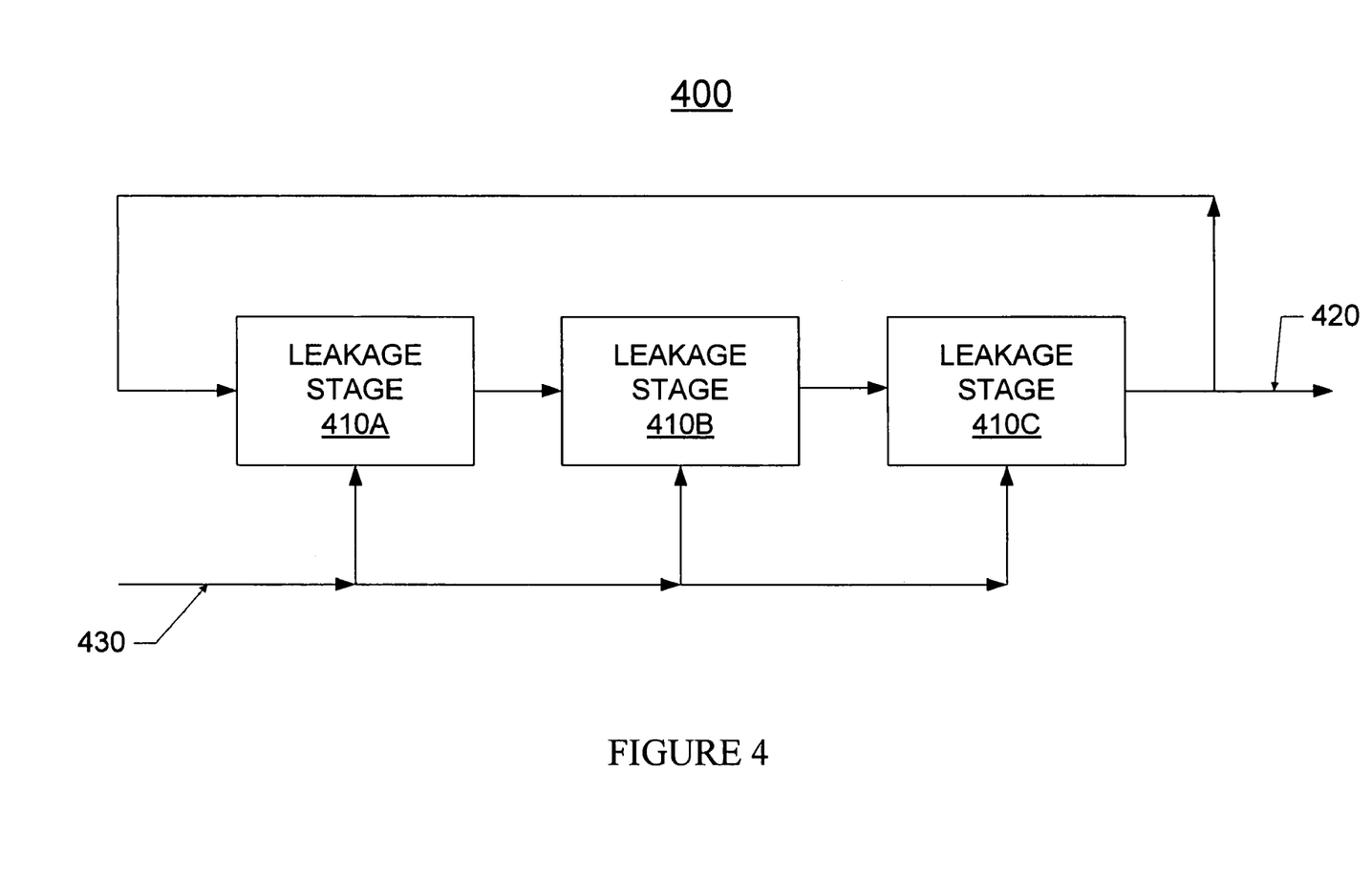
FIG. 4 is a block diagram of a leakage oscillator that may be used to monitor aging of a circuit component in a semiconductor device.

FIG. 4 is a block diagram of a leakage oscillator 400 that may be used to monitor aging of a circuit component in a semiconductor device. Like a CMOS based ring oscillator, an odd number of inverting stages is used for a pulse to propagate around the ring. In one embodiment, three stages may be used as shown in FIG. 4 where leakage stages 410A, 410B, and 410C comprise similar or identical circuits. The output 420 of stage 410C is fed back to the input of stage 410A and is also used as the final output of leakage oscillator 400. An enable input 430 is connected to all of the three stages to enable/disable the leakage oscillator. Although a three-stage leakage oscillator is illustrated by FIG. 4, a larger number of stages (e.g., 5 stages or more) may also be used. When the number of stages increases, it may be desirable to take measures to avoid multiple edges from propagating around the ring, which may lead to confusing and inconsistent results. The high level structures for a reference leakage oscillator and an aging leakage oscillator are similar except that leakage transistors in the aging leakage oscillator are stressed during operational time of a target circuit component while leakage transistors in the reference leakage oscillator are not.

Figure 5:
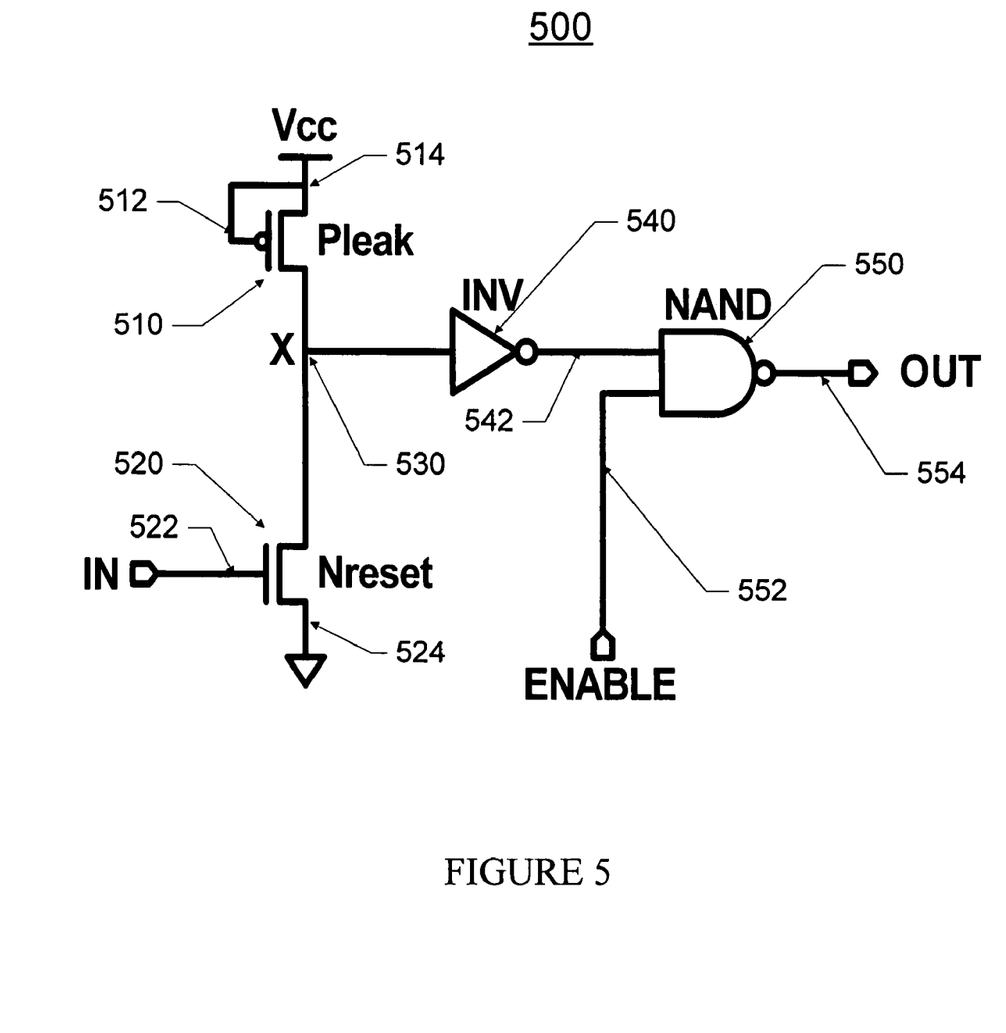
FIG. 5 shows a circuit schematic for one stage of a leakage oscillator.

FIG. 5 shows a schematic of circuit 500 for one stage of a reference leakage oscillator. Circuit 500 includes a PMOS leakage transistor (P leak 510), an NMOS reset transistor (Nreset 520), an inverter (INV 540) and a NAND gate 550. Pleak 510 is coupled to the supply voltage VCC through its source 514.

The gate 512 of Pleak 510 is connected to the source. The drain of Pleak 510 is coupled to the drain of Nreset 520 at a leakage node (X 530). Nreset 520 is coupled to input 522 of the oscillator stage through its gate, with the source 524 of Nreset 520 being coupled to the ground.

The reference leakage oscillator is enabled infrequently, only when measuring its frequency, i.e., an ENABLE input 452 to all stages is held at 0V most of time. Consequently, the output node of each stage (e.g., output node 454), which is the direct output of a NAND gate (e.g., NAND gate 550) will be at the high voltage (e.g., close/equal to the supply voltage VCC). High outputs of all the stages turn on all the Nreset transistors for all the stages and all the leakage nodes X (e.g., leakage node 530 in FIG. 5) will be pulled to 0V.

When measuring the age of a target circuit component, the reference leakage oscillator is enabled, i.e., the ENABLE input is pulled high. As a result, a pulse will begin to propagate around the ring for, just as with all ring oscillators, this is inherently an unstable circuit with an odd number of inversions around the ring. Leakage node X in a given stage will rise slowly towards VCC due to the leakage current from the source to the drain of Pleak 510, once the Nreset NMOS transistor is turned off. For a reference leakage oscillator, Pleak 510 at each stage is not stressed because its gate is always held to a high voltage.

Figure 6:
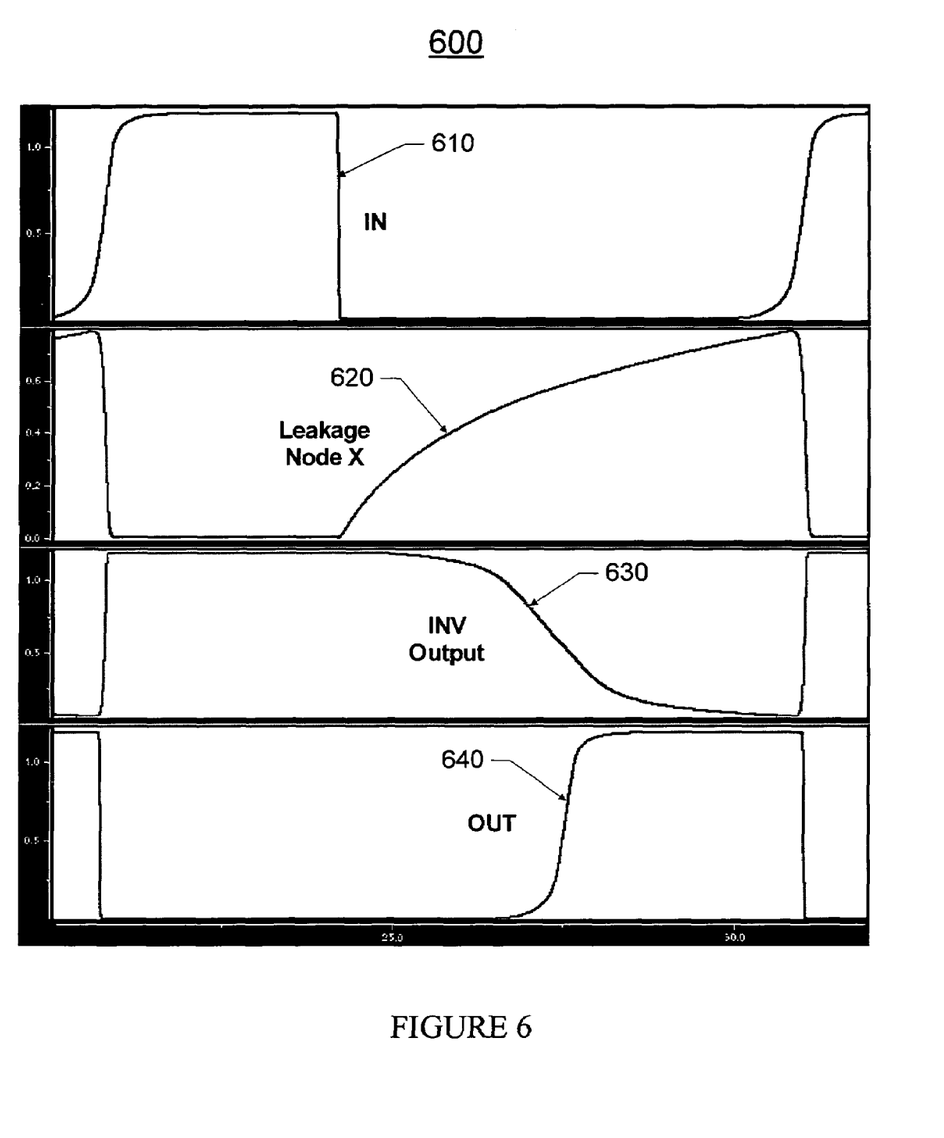
FIG. 6 shows waveforms for each of the active nodes in one stage of an enabled leakage oscillator.

FIG. 6 shows waveforms for each of the active nodes in one stage of an enabled leakage oscillator. Waveforms 610, 620, 630, and 640 are for input node 522, leakage node X 530, inverter output 542, and output node 554, respectively, in the stage of a reference leakage oscillator shown in FIG. 5. As illustrated in FIG. 5, when the input node 522 is set to high, the Nreset transistor is turned on and the leakage node X 530 is turned to low. Accordingly the inverter output 542 is turned to high. Because the ENABLE input is set to high, both inputs for the NAND gate are high and hence the output of the NAND gate turns to low. When the input node 522 turns to low, the Nreset transistor is turned off. As a result, the leakage node X 530 slowly turns to high because of the leakage current of Pleak 510. When the voltage at the leakage node X reaches a certain value, at and above which an input to the inverter is considered high, the output of the inverter turns to low. Consequently, the output of the NAND gate turns high.

How fast the leakage node X turns high when the input node is set to low depends largely on the value of the leakage current of the Pleak transistor. When the leakage current of Pleak is large, the voltage level at the leakage node X turns to high faster and the resulting frequency for the leakage oscillator is higher than when the leakage current is small. For the aging leakage oscillator, the aging effects of the Pleak transistor change its leakage current and thus change the frequency of the leakage oscillator.

Figure 7:
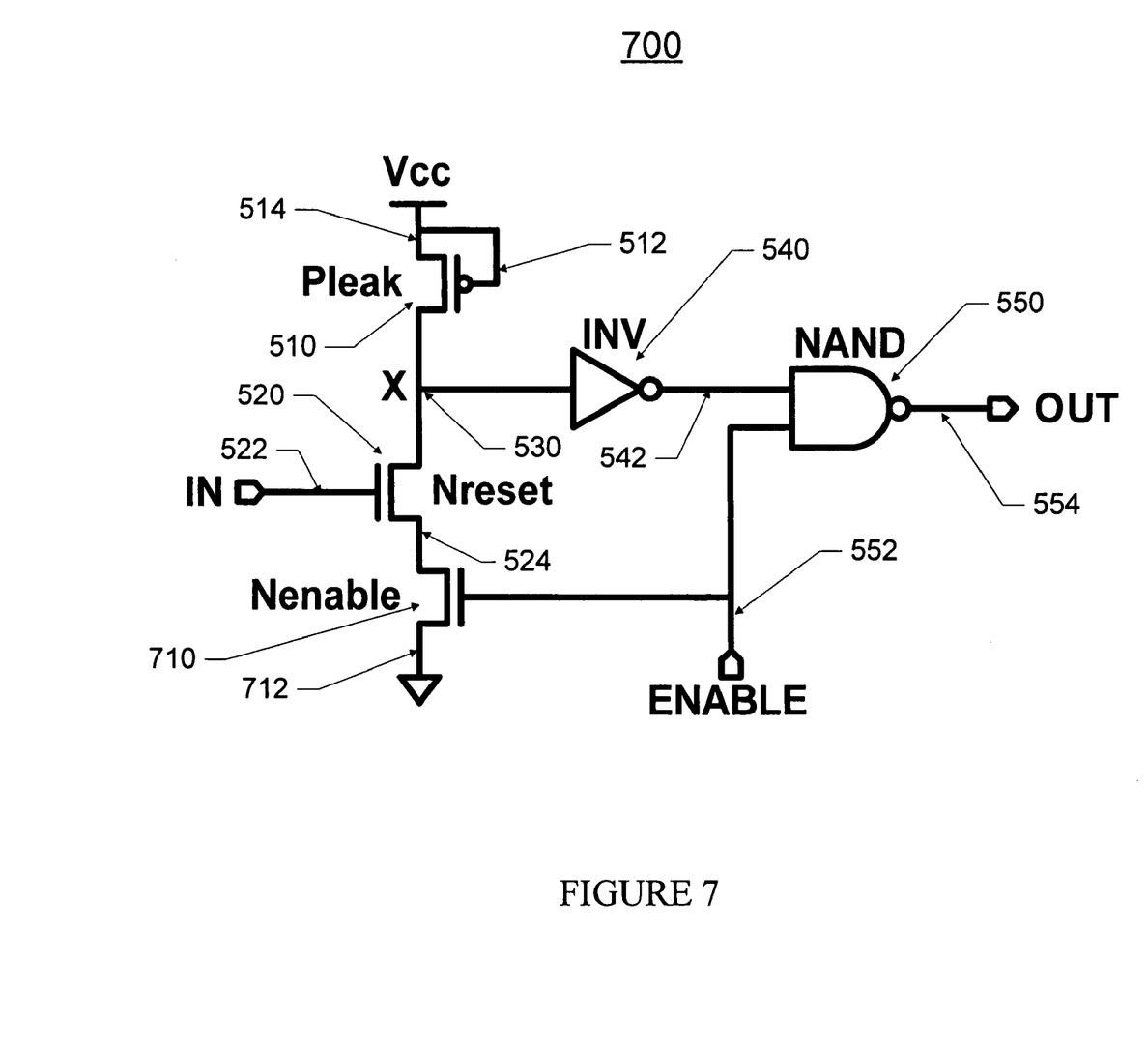
FIG. 7 shows a circuit schematic for one stage of a reference leakage oscillator for an aging monitor circuit.

FIG. 7 shows a schematic of circuit 700 for one stage of a reference leakage oscillator for an aging monitor circuit. Circuit 700 is largely the same as circuit 500 as shown in FIG. 5 except that circuit 700 includes an additional NMOS transistor Nenable 710. The source 710 of Nenable 710 is coupled to ground; the drain of Nenable is coupled to the source 524 of Nreset 520; and the gate of Nenable is coupled to the ENABLE input 552. Since the gate of Pleak 510 is connected to VCC, Pleak 510 is not stressed.

Figure 8:
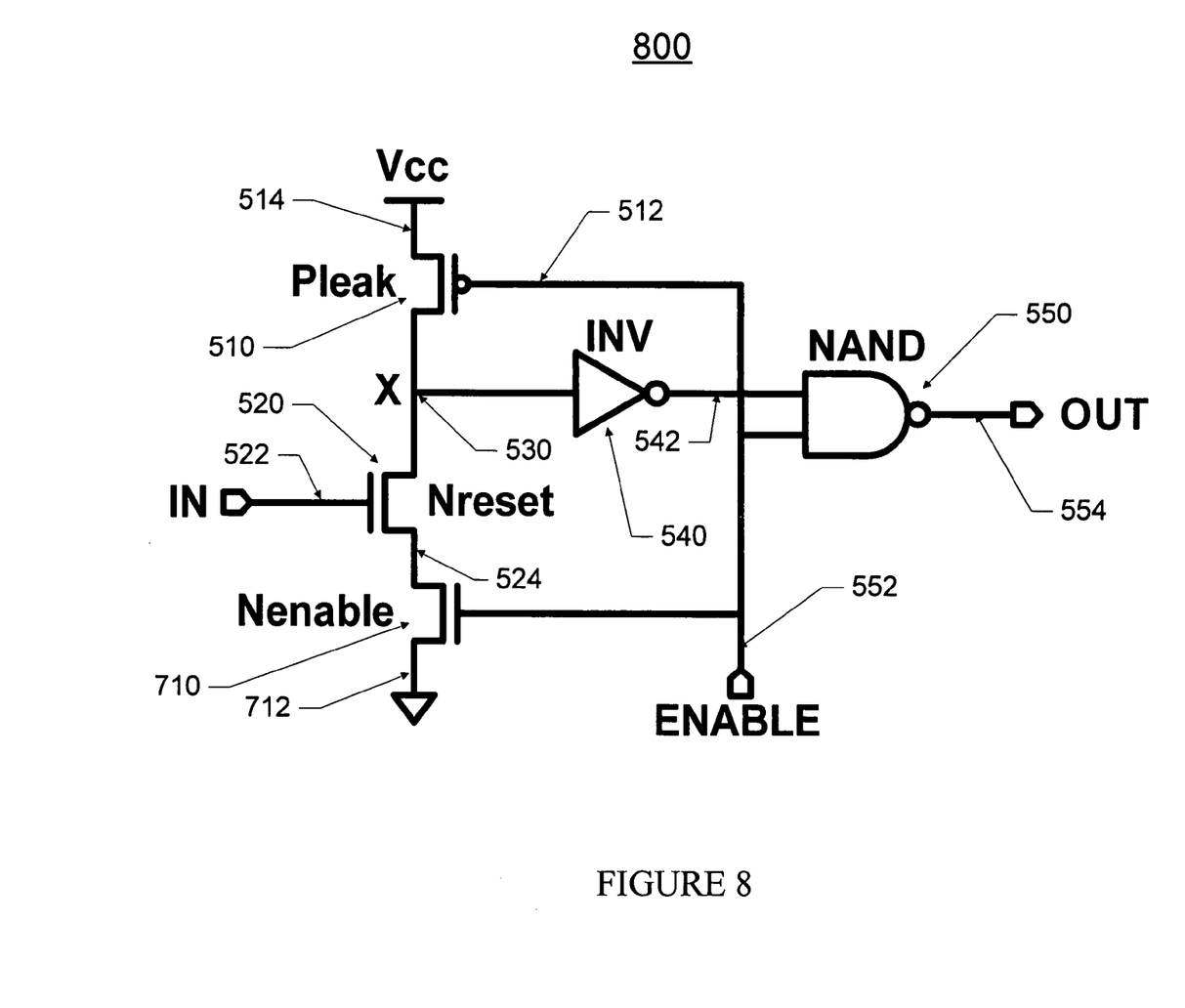
FIG. 8 shows a circuit schematic for one stage of an aging leakage oscillator for an aging monitor circuit.

FIG. 8 shows a schematic of circuit 800 for one stage of an aging leakage oscillator for an aging monitor circuit. The difference between circuit 800 and circuit 700 as shown in FIG. 7 is that in circuit 800 the gate 512 of Pleak 510 is coupled to the ENABLE input 552 while in circuit 700 the gate 512 is coupled to VCC along with the source of Pleak 510. In circuit 800, when the aging leakage oscillator is not enabled (i.e., the ENABLE input is held low), the gate of Pleak is held low and both the source and the drain of Pleak 510 are set to high (e.g., VCC). As a result Pleak 510 is under the maximum stress when the aging leakage oscillator is not enabled. The aging leakage oscillator will slow down when subjected to accumulated stress. By comparing the frequency ratio between the reference leakage oscillator and the aging leakage oscillator over time, the aging information of a corresponding target circuit component may be obtained. The reference leakage oscillator may also be used to calibrate out small differences due to different supply and temperatures during test events at "fresh" and aged conditions.

Figure 9:
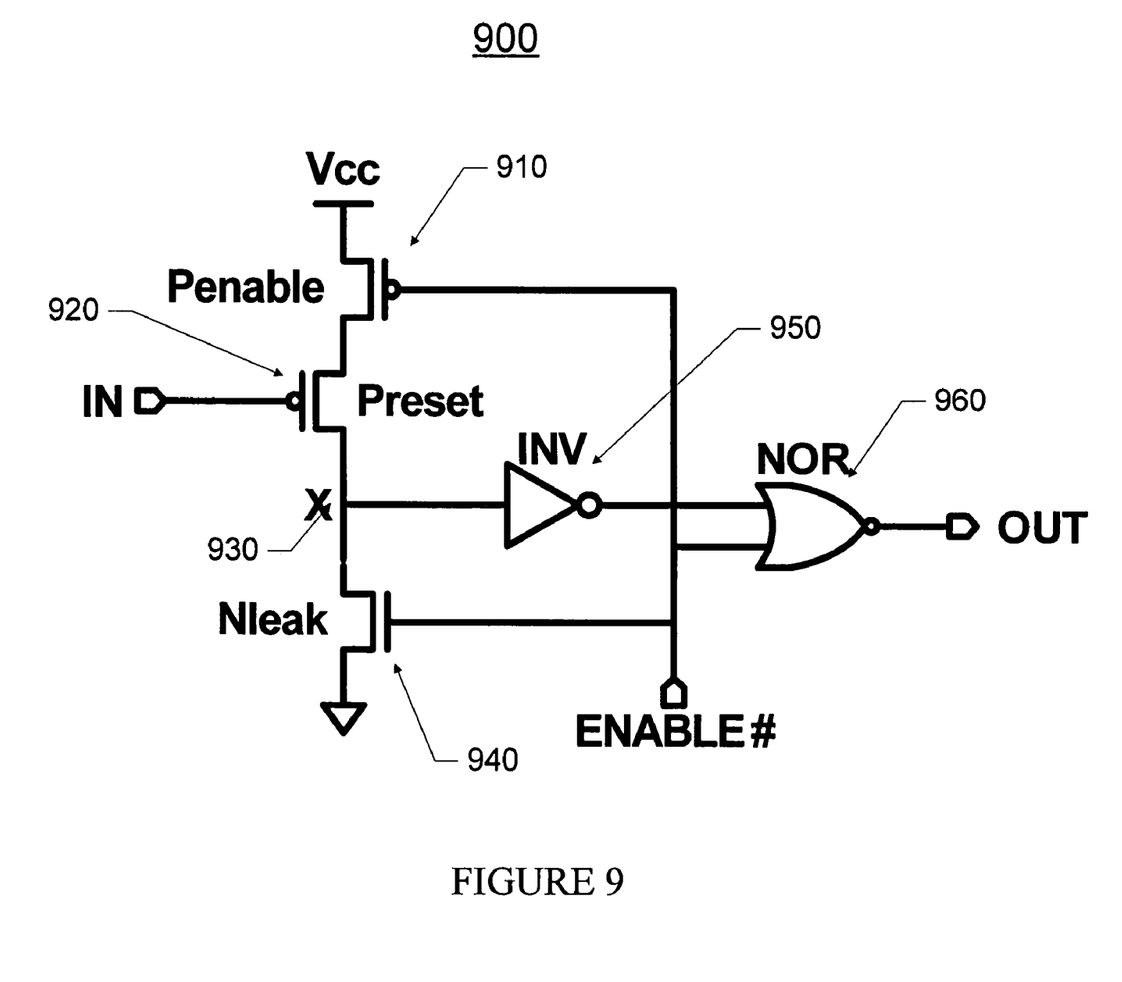
FIG. 9 shows another circuit schematic for one stage of an aging leakage oscillator for an aging monitor circuit.

Although in FIG. 5, FIG. 7, and FIG. 8, a PMOS transistor is used as the leakage transistor, circuits in these figures may be modified to use an NMOS transistor as the leakage transistor. FIG. 9 shows a schematic of circuit 900 for one stage of an aging leakage oscillator that uses an NMOS transistor as the leakage transistor. Circuit 900 includes a PMOS enable transistor Penable 910, a PMOS reset transistor Preset 920, an NMOS leakage transistor Nleak 940, an inverter 950, and a NOR gate NOR 960. The source of Penable 910 is coupled to power supply VCC; its gate is coupled to ENABLE# signal; and its drain is coupled to the source of Preset 920. The gate of Preset 920 is coupled to the input of the stage of the aging leakage oscillator. The drain of Preset 920 is coupled to the drain of Nleak 940 at the leakage node 930. The source of Nleak 940 is coupled to the ground; and the gate of Nleak 940 is coupled to the ENABLE# signal. The output of NOR 960 is also the output of the stage of the aging oscillator. In this circuit, ENABLE# is active low, i.e., the oscillator is enabled when the ENABLE# signal is held low, and the oscillator is not enabled when the ENABLE# signal is held high. The oscillator is enabled only during the measurement of its frequency. Thus, during normal operational time of the target circuit component, the aging oscillator is not enabled, the gate of Nleak 940 is held high, and Nleak 940 is stressed. In other words, Nleak 940 is not stressed only when the aging oscillator is enabled.

Although there are differences between an aging oscillator using a PMOS transistor as the leakage transistor and one using an NMOS transistor as the leakage transistor, the ways that both types of oscillators work are similar. In circuit 900, when the oscillator is not enabled (i.e., ENABLE# is high), outputs of all the stages are always low and each stage of the oscillator is stable. When the oscillator is enabled (i.e., ENABLE# turns from high to low), the oscillator becomes unstable and starts oscillating. The Nleak 940 is turned off and the leakage node X turns to high. The output of INV 950 turns to low which turns the output of the stage to high. The leakage current in Nleak 940 will slowly drive the leakage node X to low, which turns the output of INV 950 high and eventually the output of the stage to high. The aging oscillator continues oscillating until it is disabled (i.e., ENABLE# turns to high).

The circuit for one stage of a reference leakage oscillator circuit using an NMOS transistor as the leakage transistor is very similar to circuit 900, except that the gate of Nleak 940 is coupled to its source and is always held low. Thus, in a reference oscillator, the NMOS leakage transistors are not stressed whether the oscillator is enabled or not.

Figure 10:
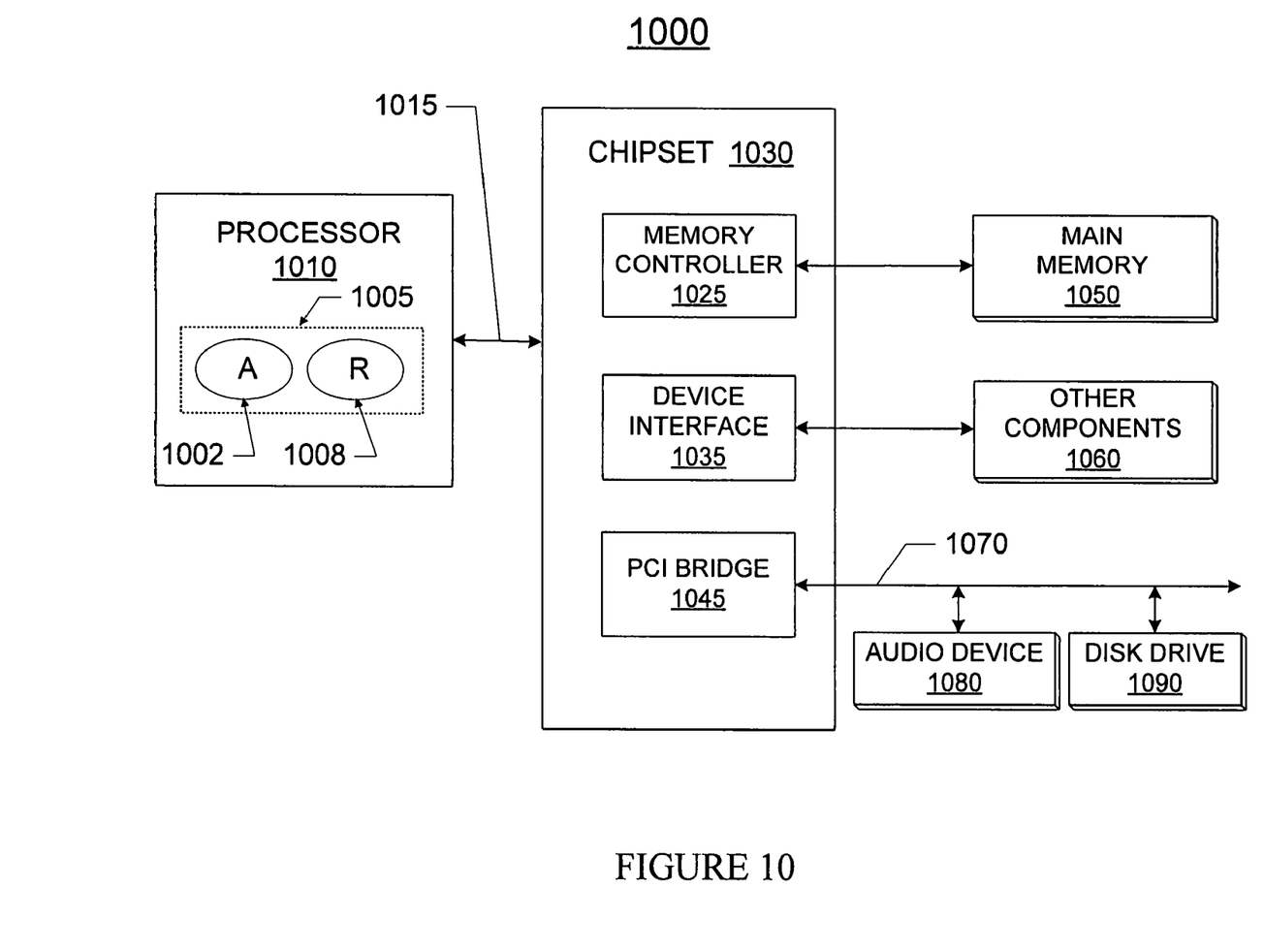
FIG. 10 shows one example computing system with a processor that uses leakage oscillator based aging monitor circuits.

FIG. 10 shows one example computing system 1000 with a processor that uses leakage oscillator based aging monitor circuits. Computing system 1000 may comprise one or more processors 1010 coupled to a system interconnect 1015. Each processor may further include one or more processing cores. Processor 1010 may include one or more aging monitor circuit 1005. An aging monitor circuit may be used for one or more circuit components in the processor. Each aging monitor circuit 1005 may include one reference leakage oscillator 1008 (labeled as "R") and one or more aging leakage oscillator 1006 (labeled as "A"). Each aging monitor circuit may be used to measure the age of a corresponding target circuit component (e.g., ALU, FPU, etc.). The aging information obtained by each aging monitor circuit may be used by a processor, an operating system ("OS"), or an software application to adjust operational conditions (e.g., operational clock, power voltage, etc.) of the target circuit component, to adjust software application parameters, to diagnose the target circuit component, and etc.

The computing system 1000 may also include a chipset 1030 coupled to the system interconnect 1015. Chipset 1030 may include one or more integrated circuit packages or chips. Chipset 1030 may comprise one or more device interfaces 1035 to support data transfers to and/or from other components 1060 of the computing system 1000 such as, for example, BIOS firmware, keyboards, mice, storage devices, network interfaces, etc. Chipset 1030 may be coupled to a Peripheral Component Interconnect (PCI) bus 1070. Chipset 1030 may include a PCI bridge 1045 that provides an interface to the PCI bus 1070. The PCI Bridge 1045 may provide a data path between the processor 1010 as well as other components 1060, and peripheral devices such as, for example, an audio device 1080 and a disk drive 1090. Although not shown, other devices may also be coupled to the PCI bus 1070.

Additionally, chipset 1030 may comprise a memory controller 1025 that is coupled to a main memory 1050. The main memory 1050 may store data and sequences of instructions that are executed by the processor 1010 or any other device included in the system. The memory controller 1025 may access the main memory 1050 in response to memory transactions associated with the processor 1010, and other devices in the computing system 1000. In one embodiment, memory controller 1050 may be located in processor 1010 or some other circuitries. The main memory 1050 may comprise various memory devices that provide addressable storage locations which the memory controller 1025 may read data from and/or write data to. The main memory 1050 may comprise one or more different types of memory devices such as Dynamic Random Access Memory (DRAM) devices, Synchronous DRAM (SDRAM) devices, Double Data Rate (DDR) SDRAM devices, or other memory devices.

Although not shown in FIG. 10, aging monitor circuits may also be used to measure the age of circuit components in parts other than the processor, such as, for example, circuit components in the chipset, the main memory, and the memory controller.

Although an example embodiment of the disclosed subject matter is described with reference to block and flow diagrams in FIGS. 1-9, persons of ordinary skill in the art will readily appreciate that many other methods of implementing the disclosed subject matter may alternatively be used. For example, some of the blocks in block diagrams and/or schematics described may be changed, eliminated, or combined.

In the preceding description, various aspects of the disclosed subject matter have been described. For purposes of explanation, specific numbers, systems and configurations were set forth in order to provide a thorough understanding of the subject matter. However, it is apparent to one skilled in the art having the benefit of this disclosure that the subject matter may be practiced without the specific details. In other instances, well-known features, components, or modules were omitted, simplified, combined, or split in order not to obscure the disclosed subject matter.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. A semiconductor device, comprising:
    a circuit component to perform a function during operation;
    a reference oscillator circuit to generate a reference signal having a reference frequency, said reference oscillator circuit being unstressed during operation of said circuit component;
    an aging oscillator circuit to generate an aging signal having an aging frequency that changes over time, said aging oscillator circuit being stressed during operation of the circuit component; and
    a frequency comparator, coupled to said reference oscillator circuit and said aging oscillator circuit, to compare said aging frequency with said reference frequency to generate an age signal being dependent upon an operational age of said circuit component;
    wherein said aging oscillator circuit and said reference oscillator circuit includes a leakage oscillator, wherein said reference oscillator circuit and said aging oscillator circuit each comprises an odd number of concatenated stages, the last stage having an output coupled to an input of the first stage, each stage including:
    a first unit having a leakage component coupled to a reset component at a connection node;
    a second unit having an inverter, the input of said inverter coupled to said connection node; and
    a third unit having a gate, a first input of said gate coupled to the output of said inverter, a second input of said gate coupled to an enable signal, and the output of said gate coupled to the output of said stage.

2. The semiconductor device of claim 1, further comprising an enable unit to disable said reference oscillator during operation of said circuit component, except when said frequency comparator compares said aging frequency with said reference frequency.

3. The semiconductor device of claim 1, further comprising:
a processing unit to produce aging information of said circuit component based on said age signal from said frequency comparator; and
a control unit to generate a control signal in response to said aging information.

4. The semiconductor device of claim 3, further comprising:
a clock regulator circuit to regulate an operating frequency of said circuit component in response to said control signal; and
a voltage regulator to regulate power supply to said circuit component in response to said control signal.

5. The semiconductor device of claim 1, wherein said leakage component comprises a p-type transistor, said reset component comprises an n-type transistor, and said gate comprises a NAND gate.

6. The semiconductor device of claim 1, wherein said leakage component comprises an n-type transistor, said reset component comprises a p-type transistor, and said gate comprises a NOR gate.

7. The semiconductor device of claim 1, wherein said leakage component is not stressed in said reference oscillator circuit.

8. The semiconductor device of claim 1, wherein said reset component is coupled to the input of said stage.

9. The semiconductor device of claim 1 comprises a processor, and said circuit component comprises one of an arithmetic logic unit ("ALU") and a floating point math unit ("FPU") in said processor.

10. The semiconductor device of claim 1, further comprising:
a plurality of circuit components;
at least one reference oscillator circuit not stressed during normal operational time of said plurality of circuit components; and
a plurality of aging oscillator circuits each located adjacent to one of said plurality of circuit components to track operational ages of each of said plurality of circuit components.

11. A computing system, comprising:
synchronous dynamic random access memory ("SDRAM"); and
a processor coupled to access said SDRAM, said processing including:
a circuit component to perform a function during operation;
a reference oscillator circuit to generate a reference signal having a reference frequency, said reference oscillator circuit being unstressed during operation of said circuit component;
an aging oscillator circuit to generate an aging signal having an aging frequency that changes over time, said aging oscillator circuit being stressed during operation of the circuit component; and
a frequency comparator, coupled to said reference oscillator circuit and said aging oscillator circuit, to compare said aging frequency with said reference frequency to generate an age signal being dependent upon an operational age of said circuit component;
wherein said aging oscillator circuit and said reference oscillator circuit includes a leakage oscillator, wherein said reference oscillator circuit and said aging oscillator circuit each comprises an odd number of concatenated stages, the last stage having an output coupled to an input of the first stage, each stage including:
a first unit having a leakage component coupled to a reset component at a connection node;
a second unit having an inverter, the input of said inverter coupled to said connection node; and
a third unit having a gate, a first input of said gate coupled to the output of said inverter, a second input of said gate coupled to an enable signal, and the output of said gate coupled to the output of said stage.

12. The computing system of claim 1, wherein said processor further comprises an enable unit to disable said reference oscillator during operation of said circuit component, except when said frequency comparator compares said aging frequency with said reference frequency.

13. The computing system of claim 11, wherein said processor further comprises:
a control unit to generate a control signal in response to said age signal;
a clock regulator circuit to regulate an operating frequency of said circuit component in response to said control signal; and
a voltage regulator to regulate power supply to said circuit component in response to said control signal.

14. The computing system of claim 11, wherein said leakage component comprises a p-type transistor, said reset component comprises an n-type transistor, and said gate comprises a NAND gate.

15. The computing system of claim 11, wherein said leakage component comprises an n-type transistor, said reset component comprises a p-type transistor, and said gate comprises a NOR gate.

16. The computing system of claim 11, wherein said leakage component is not stressed in said reference oscillator circuit.

17. The computing system of claim 11, wherein said reset component is coupled to the input of said stage.

18. The semiconductor device of claim 1, wherein:
said aging oscillator circuit is located adjacent to said circuit component; and
said reference oscillator is electrically isolated from said circuit component during operation.

19. The computing system of claim 11, wherein:
said aging oscillator circuit is located adjacent to said circuit component; and
said reference oscillator is electrically isolated from said circuit component during operation.

20. The semiconductor device of claim 1, wherein said leakage component is stressed in said aging oscillator circuit when said aging oscillator circuit is not enabled.

21. The computing system of claim 11, wherein said leakage component is stressed in said aging oscillator circuit when said aging oscillator circuit is not enabled.

* * * * *

UNITED STATES PATENT AND TRADEMARK OFFICE
CERTIFICATE OF CORRECTION

PATENT NO. : 7,592,876 B2  Page 1 of 1
APPLICATION NO. : 11/298018
DATED : September 22, 2009
INVENTOR(S) : Paul F. Newman It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 145 days.

Signed and Sealed this

Twenty-first Day of September, 2010

David J. Kappos
*Director of the United States Patent and Trademark Office*